United States Patent [19]

Kalawsky

[11] Patent Number: 4,829,165

[45] Date of Patent: May 9, 1989

[54] OPTICAL CONTROL SYSTEMS

[75] Inventor: Roy S. Kalawsky, Brough, England

[73] Assignee: British Aerospace Public Limited Company, London, England

[21] Appl. No.: 854,799

[22] Filed: Apr. 23, 1986

[30] Foreign Application Priority Data

Apr. 24, 1985 [GB] United Kingdom ............... 8510467

[51] Int. Cl.⁴ .......................... G06K 7/10; G06F 3/02
[52] U.S. Cl. ..................................... 235/375; 235/462;
235/473; 250/227; 350/96.16; 341/14; 341/31
[58] Field of Search ............... 250/227, 229, 551, 555,
250/231 SE, 231 R, 233; 340/365 P, 365 R;
235/473, 462, 464, 375, 376, 383, 454, 461, 439;
350/96.16, 96.19, 96.10

[56] References Cited

U.S. PATENT DOCUMENTS

| 3,614,402 | 10/1971 | Higgins | 250/227 |
| 4,284,885 | 8/1981 | Swensen | 250/229 |
| 4,315,147 | 2/1982 | Harmer | 250/227 |
| 4,346,292 | 8/1982 | Routt et al. | 235/462 |
| 4,379,968 | 4/1983 | Ely et al. | 250/229 |
| 4,417,824 | 11/1983 | Paterson et al. | 340/365 P |
| 4,442,425 | 4/1984 | Eibner | 340/365 R |
| 4,480,184 | 10/1984 | Ely | 250/227 |
| 4,634,861 | 1/1987 | Ching et al. | 250/229 |

FOREIGN PATENT DOCUMENTS

| 0030477 | 6/1981 | European Pat. Off. . | |
| 0047110 | 3/1982 | European Pat. Off. . | |
| 0080318 | 6/1983 | European Pat. Off. . | |
| 0094828 | 11/1983 | European Pat. Off. . | |
| 0114197 | 8/1984 | European Pat. Off. | 340/365 P |
| 0147097 | 7/1985 | European Pat. Off. . | |
| 1419622 | 12/1975 | United Kingdom . | |
| 2073881 | 10/1981 | United Kingdom . | |
| 2114834 | 8/1983 | United Kingdom . | |
| 2131989 | 6/1984 | United Kingdom . | |

OTHER PUBLICATIONS

Smith, "Optical Keyboard Encoding System", IBM Technical Disclosure Bulletin, vol. 5, No. 6, 11/62, pp. 84-85.

Matino, "Optical Keyboard", IBM Technical Disclosure Bulletin, vol. 20, No. 2, 7/77, pp. 641-642.

Uberbacher, "Optical Keyboard", IBM Technical Disclosure Bulletin, vol. 17, No. 3, 8/74, pp. 822-823.

Primary Examiner—Alan Faber
Assistant Examiner—Robert A. Weinhardt
Attorney, Agent, or Firm—Cushman, Darby & Cushman

[57] ABSTRACT

A control system suitable for incorporating in control panels and effecting remote control of apparatus includes a light guide bus system including input and output light guides and optical switches carried on a removable optical bridge member bridging in use the input and output light guides so that the switches may be selectively connected into the bus system. Each switch is of a known optically encoding type which on operation of that switch passes its particular control code into the light guide bus system for subsequent decoding and appropriate control of the apparatus.

4 Claims, 6 Drawing Sheets

OPTICAL CONTROL SYSTEMS

FIELD OF THE INVENTION

This invention relates to control or signalling systems and control or signalling devices therefor.

BACKGROUND TO INVENTION

A control system basically includes a control device (a switch for example) connected, by means of circuitry, to apparatus it controls.

In simple systems each control device is connected directly to the apparatus it controls, thus necessitating a generally independent system for each piece of appartus to be controlled.

In a more advanced electronic system replacing several independent systems, the control devices are connected to their respective pieces of apparatus to be controlled via a processing computer. Thus information from each control device is available to the system as a whole. Furthermore, in this case the various control devices may share common circuitry. This physically reduces the amount of wiring but requires that each control device must have its own characteristic signal code. As a corollary, there must be a de-coding arrangement to provide correct routing of control signals.

These electronic control systems have grave disadvantages in that they tend to cause radio frequency emissions, which may, in a war-like environment, be of sufficient magnitude to attract the attention of an enemy, who can then apply electronic counter measures or launch weapons against the vehicle. In the latter case, the emissions may be of sufficient magnitude to provide homing for a weapon guidance system. A further disadvantage is that, even in a non war-like environment, high energy transmissions from radar or radio stations can cause interference with the correct functioning of such a control system.

One object of the present invention is to provide a control system which not only does not emit to radio frequencies but also is not susceptible to outside interference.

A further objective is to provide a control system which is readily adaptable to change so that changes can be cheaply and rapidly made to suit new requirements.

It is yet a further objective to provide a control system which is robust, simple, has few moving parts, and is sufficiently lightweight to be used in aircraft embodiments.

The invention utilizes one or more control devices such as a push-button, rotary or toggle switches and circuitry associated therewith in which, the circuitry comprising light guide means with light emitting means and light receiving means, the control device having a movable element with modulation means associated with the movable element arranged to vary the light transmitted between the light emitting means and the light receiving means in response to movement of the movable element. Such control devices have been described generally in IBM technical disclosure bulletin Vol. 20, No. 2, July 1977.

Preferably where there is a plurality of control devices, the modulation means of each is provided with coding means to provide each with its own signalling code. In this case, the light guide means may comprise a single input light guide, including light splitting means for directing a proportion of the light therein to the light emitting means of a control member for coding, whilst transmitting the remainder to a further splitting means, and a single output light guide means including light combining means for combining the modulated output into the single output light guide. An arrangement such as this is described generally in IBM technical disclosure bulletin Vol. 17, No. 3, August 1974.

The light guide means may comprise, instead of separate input and output light guides, a single light guide combining the functions of both. In this case, the function of light emitting and receiving can be combined in a series of individual emitting/receiving means. Similarly, the light splitting and combining functions can be combined in a series of individual splitting/combining means.

CONCISE SUMMARY OF INVENTION

According to the invention in a control system of the type referred to above, the light splitting means and the light combining means together with the output and input light guide means are carried on a fixed member of a control panel whilst the control devices are carried on a removable bridging member of the control panel which in use bridges and provides an optical path between the input and output light guide means. In this case, the removable member is provided with light accepting means located to accept light directed by the splitting means and with light projecting means located to pass light into the light combining means.

BRIEF DESCRIPTION OF THE DRAWINGS

Some aspects of the invention are described by way of example with reference to the accompanying drawings in which

FIG. 1 is a linear motion switch,

FIG. 2 is a rotary motion switch,

FIG. 3 is a pivotal or rocking motion switch,

FIG. 4 is a diagram of a typical Bar Code,

FIG. 5 is a plan view of a control panel according to the invention,

FIG. 6 is a sectional view on lines VI—VI of FIG. 5,

FIG. 7 is a diagrammatic perspective view of part of the control panel of FIGS. 5 and 6, FIG. 8 is a diagrammatic plan view of that part of FIG. 5 indicated in Box VIII, showing a light distribution arrangement, FIG. 9 is a further diagrammatic plan view of that part of FIG. 5 indicated in Box VIII, showing an alternative light distribution arrangement, and, FIG. 10 is an end view of Arrow X of FIG. 9.

DESCRIPTION OF THE PREFERRED EMBODIMENTS

Figure 1:
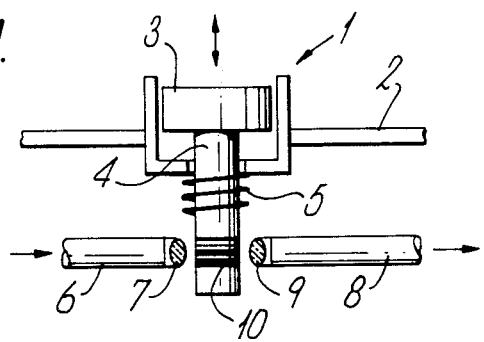
FIGS. 1 to 4 show optical switches and a bar code designed according to known principles and FIGS. 5 to 10 illustrate the invention. In particular.

In FIG. 1, a control device in the form of a linear motion switch 1 is mounted in a control panel 2. In essence the switch comprises a push button 3 carrying a shaft 4 which extends behind the control panel. A return spring is shown at 5. The push button 3 and shaft 4 comprise the movable element of the switch.

Behind the panel is provided circuitry by means of which information from the switch is passed to apparatus to be controlled by the switch via a processing computer.

The circuitry includes a light guide 6 (that is to say a fibre optic cable) fed from a light source in a manner to be described. The light guide 6 terminates in a single lens collimator 7 and is so positioned with respect to the shaft 4 that collimated light is projected onto the shaft. The circuitry further includes, on the remote side of the shaft, a light guide 8 also with a collimating lens 9. This guide feeds into a processing computer in a manner to be described. The shaft is formed of a transparent material, for example acrylic or similar plastics material, so that light projected by the lens 7 passes through the shaft, is received by the lens 9 and is fed into the light guide 8.

To provide a signal related to the movement of the movable element of the switch (that is to say the control device) the shaft 4 is formed with modulation means in the form of one or more opaque regions 10 which interrupt the passage of light through it. Additionally to this, to provide each switch with its own characteristic signal code the opaque regions are formed in a particular pattern. This can be for example a bar code of the type used in libraries and supermarkets to effect stock control. A typical arrangement is later described with reference to FIG. 4.

Such a bar code forming the modulator naturally requires a decoding arrangement in the processing computer, but such items are very well known.

The switch of FIG. 1 provides a momentary action push button arrangement. This can be adapted to provide a latching push button arrangement (i.e. when depressed the button stays depressed until released) by an additional mechanism, not shown, physically providing a latch, or preferably by a signalling code provided by the bar code and accepted by the decoding arrangement as a permanent signal until cancelled by further movement of the switch.

Figure 2:
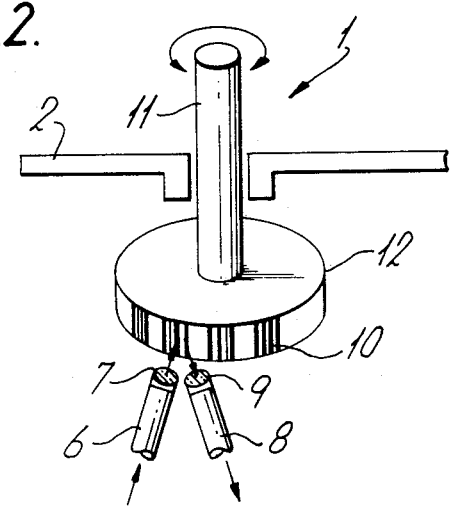

In FIG. 2, in which like components are given like reference numerals, a control device 1 is illustrated as a rotary motion switch having a rotary shaft 11 carrying a drum 12 so positioned with respect to the collimating lenses 7 and 9 that light from one is reflected from the drum periphery to the other. A bar code 10 is formed upon the periphery of the drum to provide modulation of the light as previously described.

Figure 3:
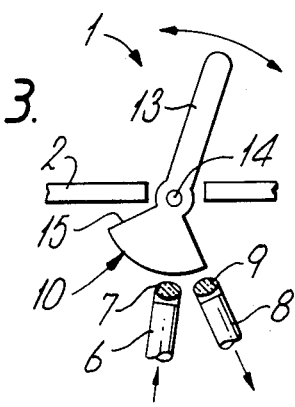

FIG. 3 discloses a control device 1 in the form of a pivotal motion switch. A switch lever 13 is pivoted about a transverse axis 14 and carries a segment or vane 15 on a peripheral portion of which is carried a bar code 10 to provide modulation of light received from lens 7 and reflected onto lens 9.

In each case, the guide 6 may carry both the modulated and non-modulated light. In FIG. 1, the guide 8 may be provided with combining means to interconnect it with the guide 6. Alternatively, the shaft may be reflective, after the manner of the disclosure of FIGS. 2 and 3 so that only the guide 6 and the lens 7 are necessary. This latter arrangement of combined guides 6 and 8 can also apply to FIGS. 2 and 3.

Figure 4:
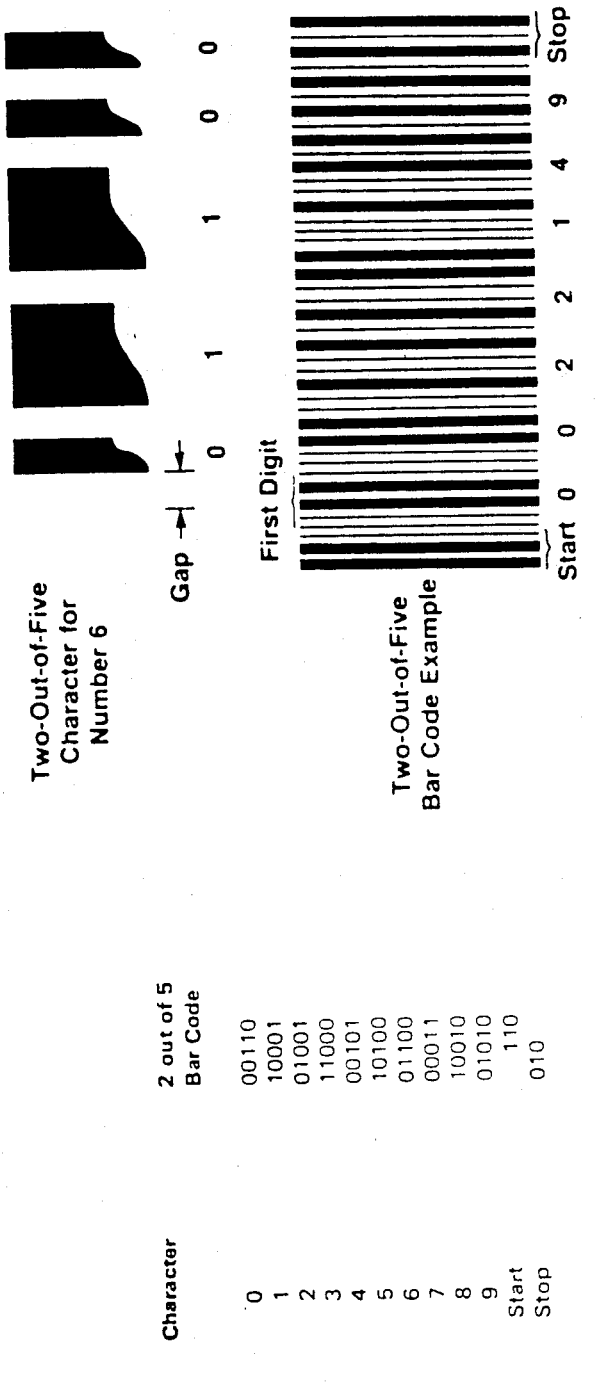

Referring now to FIG. 4, bar codes are commonplace in supermarkets and libraries where they are used to label products. A simple 'wand' or light pen is manually scanned across the pattern of spaces and bars, data from the wand being entered into a computer. The pattern of spaces and bars usually have a numerical code printed below which suggest some form of connection between the bar pattern and the number printed. User examination reveals that the bars are placed irregularly apart. In fact, information can be coded in terms of different width bars and irregular spacing, etc.; indeed there are many different standards for bar codes. All systems however, have one thing in common and that is to distingusih bars from spaces as the light pen is scanned across the bar patern.

Bar codes have been designed primarily for hand operation and therefore due to differences between scanning times, considerable car has had to be taken when decoding the signals from the pen to allow for different hand speeds. To understand how bar codes work a simple code will be used as an example.

The simplest variation is the '2 out of 5' bar code. This uses five bars to represent a single digit. Two out of five bars are wider than the other three - hence the code's name. The complete code is shown in FIG. 4. The narrow bars stand for '0's and the (three times) wider ones represent '1's. Reading errors are avoided in three ways. In the first place, exactly two out of every five bars must be wider. If not, the read-out comes to a halt. The second check concerns the number of bars; between the start and stop signs the five bars pattern appears a certain number of times, and so the total number of bars must be a multiple of five. The start and stop signs enable the computer to determine in which direction to read the data. The third check for mistakes involves a simple addition of all digits, after which the last digit of the sum is placed behind the figures (i.e. in front of the stop sign). This is shown in FIG. 4 as:

$$2+2+1+4=9$$

If the first two zeros had been an eight and a two, respectively, this would have given the same result:

$$8+2+2+1+4=19,$$

as only the 9 is added.

A bar code reader must be independent of the read speed, an angle of, the light pen, therefore some codes have error recovery codes built into them. If the angle of the light pen is made constant then less complicated bar codes can be used because errors are eliminated more easily.

In the latter respect, it can be seen that errors inherent in the use of a hand held 'wand' are removed by the use of fixed angles between the lenses 7 and 9 and the modulator.

There is little point in adopting bar coding, or any form of coding for that matter, if each control device requires individual light guides from source to the apparatus to be controlled, or to the control computer.

Figure 5:
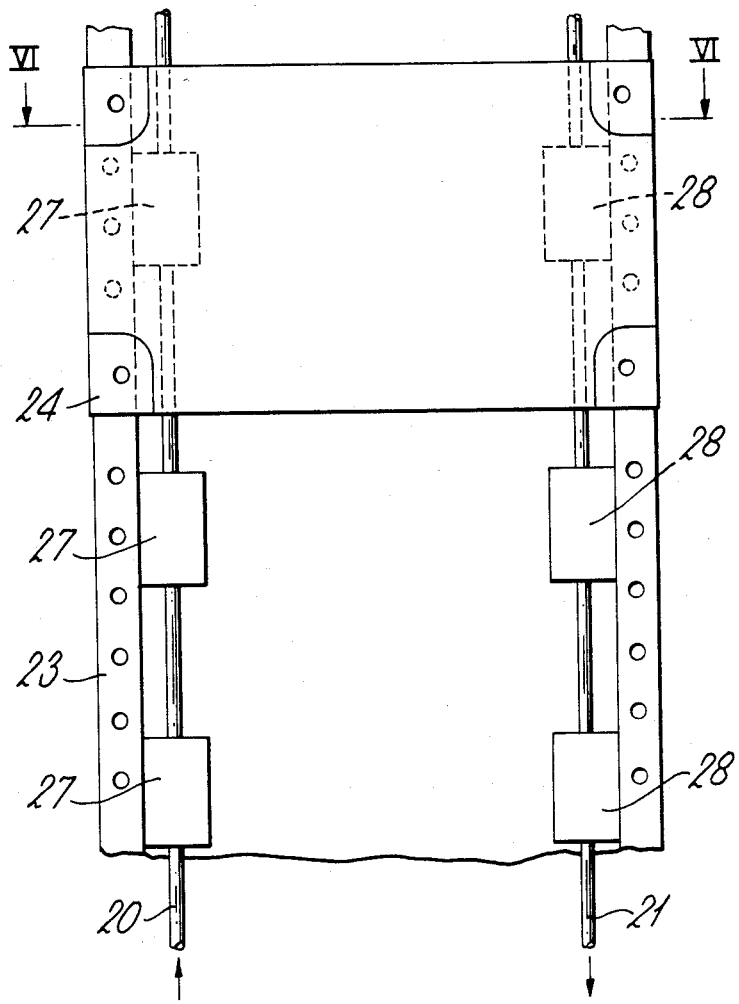
Figure 6:
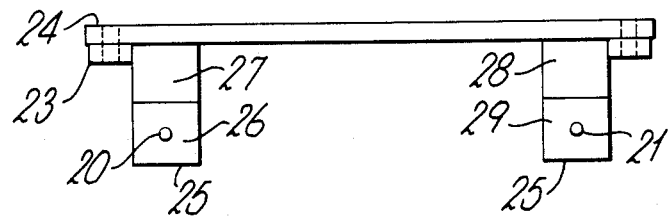
Figure 7:
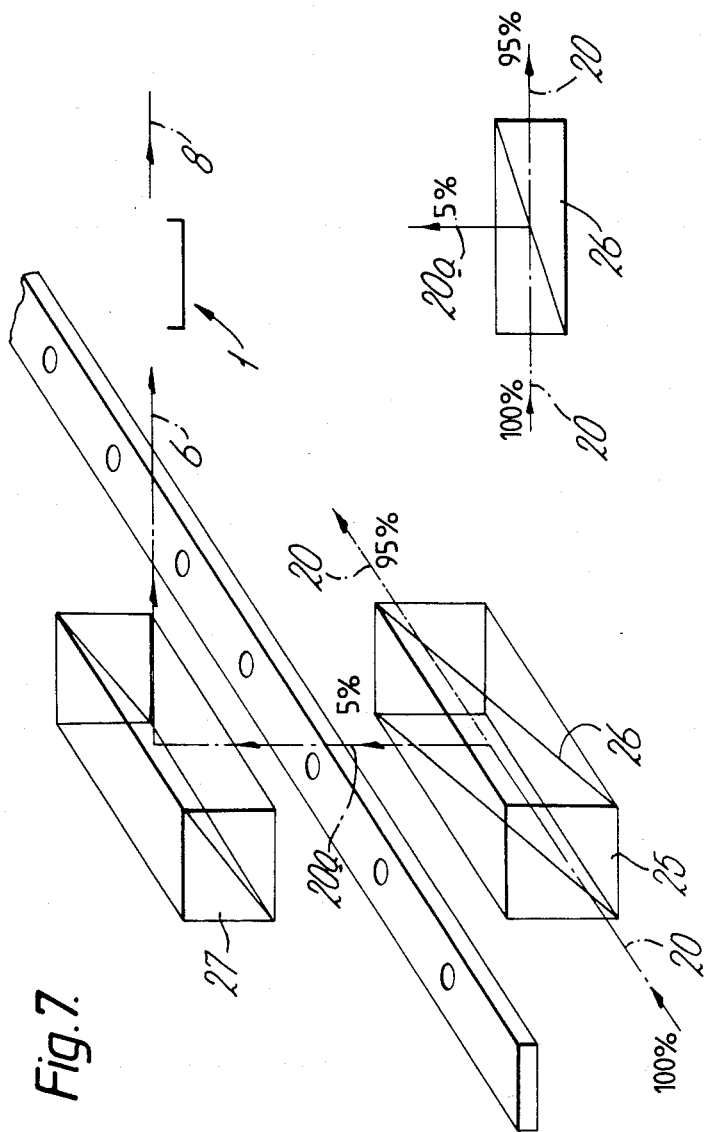

FIGS. 5, 6 and 7 illustrate an arrangement where a single input light guide 20 and a single output light guide 21 are provided (after the manner of parallel bus bars in electrical technology) to provide circuitry for a plurality of control devices.

This arrangement facilitates the provision of readily removable and replaceable control panels leading to rapid interchangeability.

A control panel is formed in two parts, a fixed part 23 forming part of a control station, and a removable bridging part 24. The fixed part 23 normally forms the rear whilst the removable part forms the front face of the control panel and carries the control devices 1. The fixed part carries the input and output light guides 20 and 21 respectively and also carries, at regular intervals along the guides, light coupling interface means 25. The removable bridging part 24 provides a bridge between the input and output light guides and in the form of a controllable optical path therebetween. The interface means 25 on the input light guide 20 are formed by beam splitters 26 which transmit say 95% of light along the guide 20 but deflect say 5% for use by an individual control device 1. The deflected portion, indicated as a ray at 20a in FIG. 7, is passed from the fixed portion 23 to the removable portion 24 of the panel where it is collected by a prism arrangement 27 for direction to a particular control device 1 along that light guide referenced 6 in the earlier Figures. This part of the bridging portion 24 may be described as an input bridging light guide because it provides an input optical signal to the device 1. The light modulated by control devices 1 is subsequently received into that light guide referenced 8. This part of the bridging portion 24 may be described as an output bridging light guide because the modulated light from the control device 1 is passed by it into the output light guide 21 by a similar prism arrangement 28 which projects the modulated ray onto a combining device 29 (again forming part of the series of light coupling interface means 25).

Figure 8:
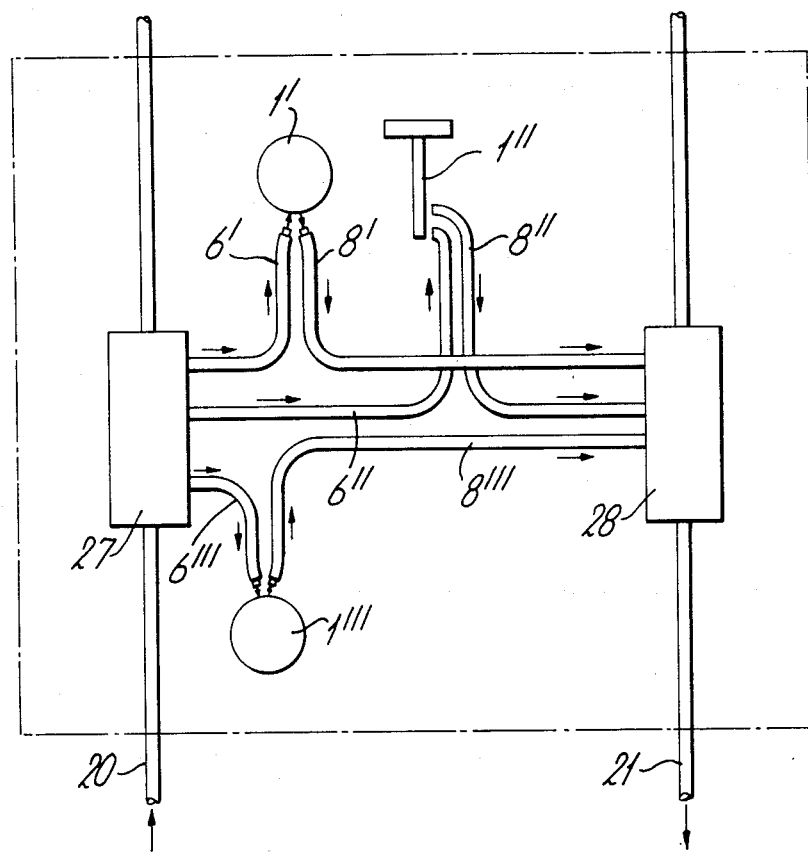

FIG. 8 illustrates the use of discrete light guides. As is shown, three control devices 1',1", and 1''' are illustrated, those referenced 1' and 1''' being of the rotary switch type illustrated in FIG. 2, whilst that referenced 1" is of the linear of push button switch type illustrated in FIG. 1. Light guides 6',6", and 6''' form input bridging light guides and deliver light to the respective switches whilst light guides 8',8", and 8''' form output bridging eight guides and accept modulated light from the respective switches.

As previously discussed, the guides 8',8", and 8''' are not present if their function is effected by the guides 6',6", and 6''' i.e., the functions of the input bridging light guides and the output bridging light guides are effectively combined.

Figure 9:
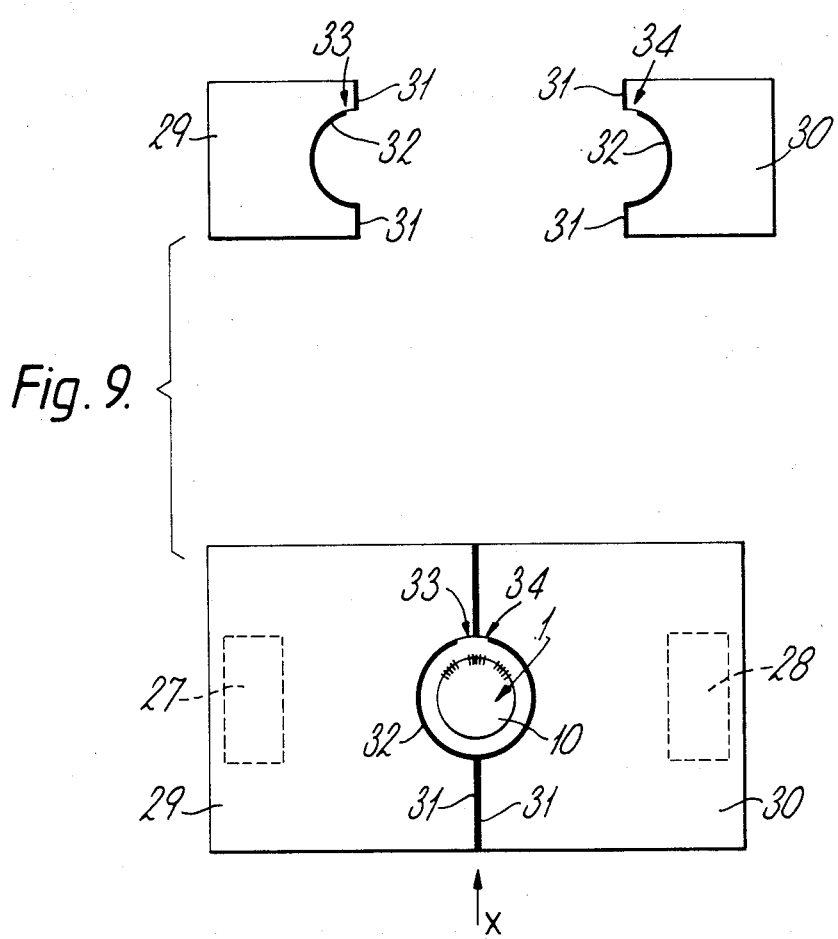
Figure 10:
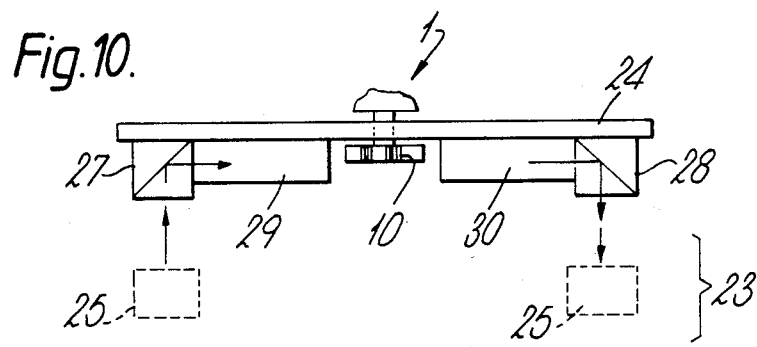

In FIGS. 9 and 10, the panel portion 24 carrying the control devices or switches 1 is itself made of light transmitting material, or has blocks of that material attached. In other words, the function of the light guides 6, or 6 and 8 as the case may be, is effected by the panel.

In this embodiment, the prism arrangement 27 feeds light into a block 29 of acrylic material which in effect is the equivalent of a light guide 6. A block 30 of similar material forms the equivalent of a light guide 8. The blocks 29 and 30 have mating edge faces 31 each with a semi-circular cutout 32. These faces 31 and parts of the cutouts 32 are painted black to prevent light passing from one block to the other block without being modulated by a control device 1. The control device 1, illustrated by way of example as a rotary switch of the type of FIG. 2, is carried by the panel 24 in such a manner that its drum 10 lies within the cutouts 32 (which, as is shown combine to form a single circular aperture when the faces 31 of the blocks are mated). Light carried by the block 29 is directed onto the drum 10 through that region 33 of the cutout 32 not blacked is reflected therefrom, suitably modulated, into the block 30 through an un-blacked region 34 of that cutout 32 associated with the block 30 and thence to the prism 28.

Again, the block 30 may not be present if the block 29 provides the dual function of carrying both modulated and non-modulated light.

What is claimed is:

1. An optical control system including a control device and circuitry associated therewith, the circuitry comprising:

light guide means with light emitting and light receiving means, the device having a movable element with light modulation means associated with the movable element for varying the light transmitted between the light emitting means and the light receiving means in response to movement of the movable element, in which the light guide means includes an input light guide and an output light guide arranged in a parallel bus arrangement, input bridging light guide means and output bridging light guide means locatable at a plurality of selectable locations for bridging said parallel bus arrangement at one of said plurality of selectable locations and for guiding light into and out of the said at least one control device, from said light emitting means and to said light receiving means respectively, a first plurality of light coupling interface means mounted at predetermined intervals defining said selectable locations along said input light guide for coupling said input bridging light guide means to said input light guide, and a corresponding second plurality of light coupling interface means mounted at corresponding intervals along said output light guide for coupling said output bridging light guide means to said output light guide.

2. An optical control system including a control device and circuitry associated therewith comprising:

light guide means with light emitting and light receiving means, the light guide means including an input light guide and an output light guide arranged in a parallel bus arrangement, a movable element with light modulation means associated with the movable element for varying the light transmitted between the light emitting means and the light receiving means in response to movement of the movable element, input bridging light guide means and output bridging light guide means for bridging and parallel bus arrangement at one of a plurality of selectable locations and for guiding light into and out of the said at least one control device, from said light emitting means and to said light receiving means respectively, a first plurality of light coupling interface means mounted at predetermined intervals defining said selectable locations along said input light guide for coupling said input bridging light guide means to said input light guide, a corresponding second plurality of light coupling interface means mounted at corresponding intervals along said output light guide for coupling said output bridging light guide means to said output light guide, a fixed structure, carrying said input and output light guides in the parallel bus arrangement and the first and second coupling interface means and, a removable structure for carrying said at least one control device and the input and output bridging light guide means, said removable bridging structure locatable at any one of said plurality of selectable locations, the removable bridging structure further carrying reflector means for transmitting light from the coupling interface means to the bridging light guide means.

3. A control system according to claim 2, wherein the bridging light guide means are in the form of discrete light guides.

4. A control system according to claim 2, wherein the bridging light guide means are in the form of blocks of light transmitting material.

* * * * *